United States Patent
Wataru (10) Patent No.: US 11,245,335 B2
(45) Date of Patent: Feb. 8, 2022

(54) DC/DC CONVERTER

(71) Applicant: Yazaki Corporation, Tokyo (JP)

(72) Inventor: Kazuhisa Wataru, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 203 days.

(21) Appl. No.: 16/662,629

(22) Filed: Oct. 24, 2019

(65) Prior Publication Data

US 2020/0169173 A1 May 28, 2020

(30) Foreign Application Priority Data

Nov. 28, 2018 (JP) .............................. JP2018-222778

(51) Int. Cl.
*H02M 3/158* (2006.01)
*H01L 23/64* (2006.01)
*H01L 25/18* (2006.01)

(52) U.S. Cl.
CPC ........ *H02M 3/1588* (2013.01); *H01L 23/645* (2013.01); *H01L 25/18* (2013.01)

(58) Field of Classification Search
CPC .... H02M 3/1588; H01L 23/645; H01L 25/18; H01L 23/64
See application file for complete search history.

(56) References Cited

U.S. PATENT DOCUMENTS

| 2006/0208714 A1 | 9/2006 | Saeki et al. |
| 2006/0208715 A1 | 9/2006 | Saeki et al. |
| 2009/0184352 A1* | 7/2009 | Yamaguchi ........... H01L 23/482 257/296 |
| 2009/0230939 A1 | 9/2009 | Nakazawa |
| 2010/0194361 A1 | 8/2010 | Hardman et al. |
| 2018/0110123 A1* | 4/2018 | Sturcken ............. H01L 23/5223 |
| 2019/0109538 A1* | 4/2019 | Zhou ...................... H05K 1/181 |

FOREIGN PATENT DOCUMENTS

| EP | 1 942 574 A1 | 7/2008 |
| JP | 2006-296186 A | 10/2006 |

* cited by examiner

*Primary Examiner* — Nguyen Tran
*Assistant Examiner* — Trinh Q Dang
(74) *Attorney, Agent, or Firm* — Sughrue Mion, PLLC (57) ABSTRACT

A DC/DC converter includes: electronic components group including a first capacitor, a high-voltage-side switching element, a low-voltage-side switching element, an inductor, and a second capacitor and constituting a half-bridge circuit; and a substrate including a high-voltage region, a low-voltage region, a connection region, and a pair of ground regions. The first capacitor is mounted across one of the ground regions and the high-voltage region. The high-voltage-side switching element is mounted across the high-voltage region and the connection region. The low-voltage-side switching element is mounted across the connection region and one of the ground regions. The inductor is mounted across the connection region and the low-voltage region. The second capacitor is mounted across the low-voltage region and one of the ground regions.

10 Claims, 4 Drawing Sheets

DC/DC CONVERTER

CROSS-REFERENCE TO RELATED APPLICATION(S)

The present application claims priority to and incorporates by reference the entire contents of Japanese Patent Application No. 2018-222778 filed in Japan on Nov. 28, 2018.

BACKGROUND OF THE INVENTION

1. Field of the Invention

The present invention relates to a DC/DC converter.

2. Description of the Related Art

For example, a switching converter control circuit configured to perform rectification by alternately turning on a first switch and a second switch is disclosed as a conventional DC/DC converter used in various kinds of usage. The switching converter control circuit includes a plurality of first drive units, a second drive unit, and a selection unit. The first drive units drive a plurality of first switches, respectively. The second drive unit drives a second switch. The selection unit stops some of the first drive units in accordance with load current, input voltage, output voltage, or the difference between the input and output voltages.

For example, a switching converter control circuit disclosed in Japanese Patent Application Laid-open No. 2006-296186 has room for further improvement in versatility.

SUMMARY OF THE INVENTION

The present invention is intended to solve the above-described problem and provide a DC/DC converter having improved versatility.

In order to achieve the above mentioned object, a DC/DC converter according to one aspect of the present invention includes electronic components group including a first capacitor, a high-voltage-side switching element, a low-voltage-side switching element, an inductor, and a second capacitor and forming a half-bridge circuit; and a substrate including a high-voltage region in which a high-voltage wiring pattern having a relatively high voltage is formed, a low-voltage region in which a low-voltage wiring pattern having a relatively low voltage is formed, a connection region in which a connection wiring pattern is formed, and a pair of ground regions in each of which a ground pattern is formed, wherein the connection region is positioned between the high-voltage region and the low-voltage region in a first direction and adjacent to the high-voltage region and the low-voltage region, the pair of ground regions are positioned adjacent to the high-voltage region, the connection region, and the low-voltage region with the high-voltage region, the connection region, and the low-voltage region interposed between the ground regions in a second direction intersecting the first direction, the first capacitor is mounted across any one of the pair of ground regions and the high-voltage region and has one terminal connected with the ground pattern and the other terminal connected with the high-voltage wiring pattern, the high-voltage-side switching element is mounted across the high-voltage region and the connection region and has a drain terminal connected with the high-voltage wiring pattern and a source terminal connected with the connection wiring pattern, the low-voltage-side switching element is mounted across the connection region and the one of the pair of ground regions and has a drain terminal connected with the connection wiring pattern and a source terminal connected with the ground pattern, the inductor is mounted across the connection region and the low-voltage region and has one terminal connected with the connection wiring pattern and the other terminal connected with the low-voltage wiring pattern, and the second capacitor is mounted across the low-voltage region and the one of the pair of ground regions and has one terminal connected with the low-voltage wiring pattern and the other terminal connected with the ground pattern.

According to another aspect of the present invention, in the DC/DC converter, it is possible to configure that the substrate includes a first mounting surface and a second mounting surface different from the first mounting surface, the high-voltage region, the low-voltage region, the connection region, and the pair of ground regions being formed on the first mounting surface, signal transmission patterns configured to transmit drive signals for driving the high-voltage-side switching element and the low-voltage-side switching element being formed on the second mounting surface, and the high-voltage-side switching element and the low-voltage-side switching element have gate terminals connected with the signal transmission patterns.

According to still another aspect of the present invention, in the DC/DC converter, it is possible to configure that a plurality of the first capacitors are provided, one of the first capacitors is mounted across one of the pair of ground regions and the high-voltage region, and another one of the first capacitors is mounted across the other of the pair of ground regions and the high-voltage region, a plurality of the high-voltage-side switching elements are provided and all of the high-voltage-side switching elements mounted across the high-voltage region and the connection region, a plurality of the low-voltage-side switching elements are provided, one of the low-voltage-side switching elements is mounted across the connection region and the one of the pair of ground regions, and another one of the low-voltage-side switching elements is mounted across the connection region and the other of the pair of ground regions, and a plurality of the second capacitors are provided, one of the second capacitors is mounted across the low-voltage region and the one of the pair of ground regions, and another one of the second capacitors is mounted across the low-voltage region and the other of the pair of ground regions.

According to still another aspect of the present invention, in the DC/DC converter, it is possible to configure that the substrate is provided with a plurality of unit pattern region groups each including the single high-voltage region, the single low-voltage region, the single connection region, and the pair of ground regions.

According to still another aspect of the present invention, in the DC/DC converter, it is possible to configure that the low-voltage regions of the plurality of unit pattern region groups adjacent to each other in the first direction are positioned adjacent to each other in the first direction.

According to still another aspect of the present invention, in the DC/DC converter, it is possible to configure that one of the pair of ground regions of each of a plurality of the unit pattern region groups adjacent to each other in the second direction is shared.

The above and other objects, features, advantages and technical and industrial significance of this invention will be better understood by reading the following detailed descrip-

DETAILED DESCRIPTION OF THE PREFERRED EMBODIMENTS

An embodiment of the present invention will be described below in detail with reference to the accompanying drawings. However, the present invention is not limited to the present embodiment. Each component in the embodiment described below includes a replacement easily achieved by the skilled person in the art or an equivalent in effect.

Embodiment

Figure 1:
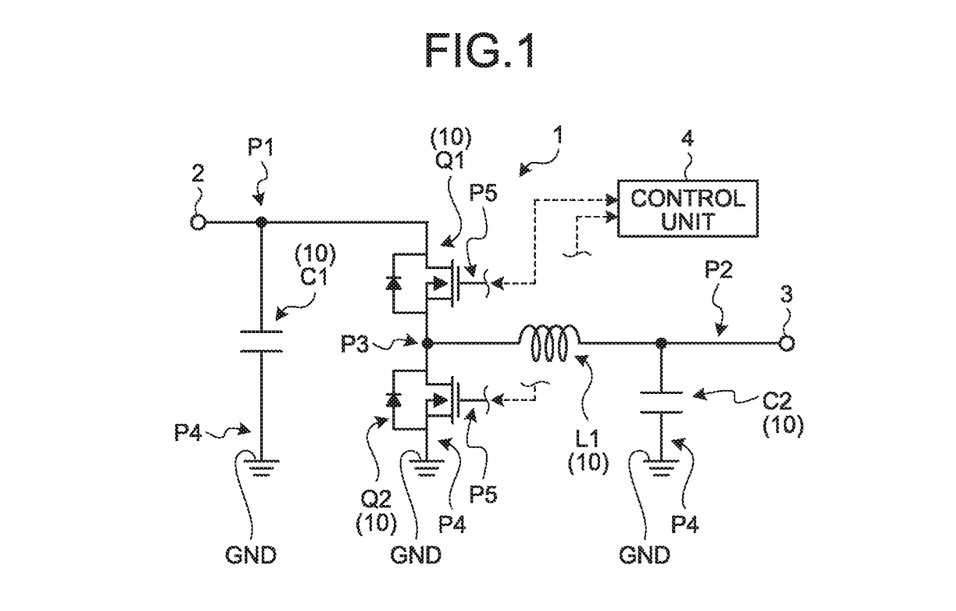
FIG. 1 is an outline configuration diagram illustrating a schematic configuration of a DC/DC converter according to an embodiment.

A DC/DC converter 1 illustrated in FIG. 1 transforms the voltage of direct-current power input through an input terminal 2, and outputs the direct-current power toward an output terminal 3. The input terminal 2 and the output terminal 3 are each connected with a power source instrument such as an electrical generator or an electrical storage device, or with an electrical instrument driven by electrical power. In the DC/DC converter 1, a step-down DC/DC converter circuit of a synchronous rectification scheme is formed by electronic components group 10 connecting the input terminal 2 and the output terminal 3. The DC/DC converter 1 according to the present embodiment includes the electronic components group 10 including a first capacitor C1, a high-voltage-side switching element Q1, a low-voltage-side switching element Q2, an inductor L1, and a second capacitor C2. The electronic components group 10 form a half-bridge circuit.

The first capacitor C1 is a passive element capable of accumulating and discharging electric charge, and is a smoothing capacitor. The first capacitor C1 has one terminal connected with a ground GND and the other terminal connected with the input terminal 2 and the drain terminal of the high-voltage-side switching element Q1. The high-voltage-side switching element Q1 and the low-voltage-side switching element Q2 may be each a field effect transistor (FET). The high-voltage-side switching element Q1 has the drain terminal connected with the input terminal 2 and the other terminal of the first capacitor C1, the source terminal connected with one terminal of the inductor L1 and the drain terminal of the low-voltage-side switching element Q2, and the gate terminal connected with a controller 4. The low-voltage-side switching element Q2 has the drain terminal connected with the source terminal of the high-voltage-side switching element Q1 and the one terminal of the inductor L1, the source terminal connected with the ground GND, and the gate terminal connected with the controller 4. The inductor L1 is a passive element capable of accumulating energy in a magnetic field formed by flowing current. The second capacitor C2 is a passive element capable of accumulating and discharging electric charge. The inductor L1 and the second capacitor C2 form a LC smoothing circuit. The one terminal of the inductor L1 is connected with the source terminal of the high-voltage-side switching element Q1 and the drain terminal of the low-voltage-side switching element Q2, and the other terminal of the inductor L1 is connected with one terminal of the second capacitor C2 and the output terminal 3. The second capacitor C2 has the one terminal connected with the other terminal of the inductor L1 and the output terminal 3 and the other terminal connected with the ground GND. The controller 4 controls switching operation by transmitting, to the high-voltage-side switching element Q1 and the low-voltage-side switching element Q2, drive signals for driving these elements. The DC/DC converter 1 converts an input voltage of direct-current power from the input terminal 2 into a predetermined output voltage through control of the duty duration (ON duration) of the high-voltage-side switching element Q1 and the low-voltage-side switching element Q2 by the controller 4, and then outputs the direct-current power through the output terminal 3.

Figure 2:
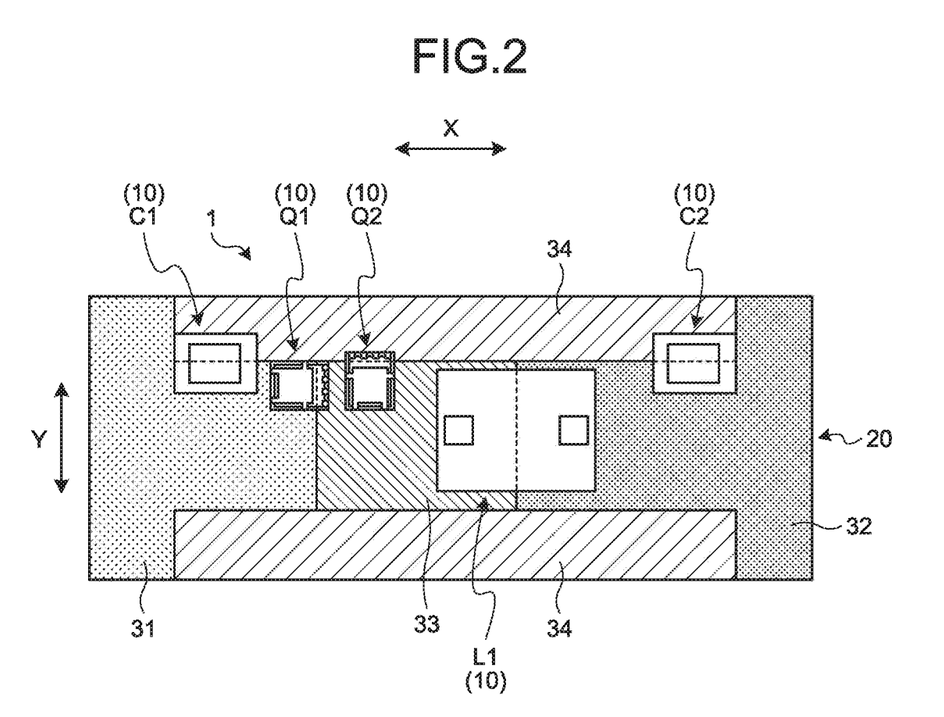
FIG. 2 is a schematic block diagram illustrating an artwork of a substrate included in the DC/DC converter according to the embodiment.

The DC/DC converter 1 according to the present embodiment includes a substrate 20 on which the above-described electronic components group 10 are mounted and form a half-bridge circuit. The DC/DC converter 1 according to the present embodiment achieves improved versatility by contriving artwork (substrate pattern designing) of the substrate 20 as illustrated in FIG. 2.

Specifically, the substrate 20 provides an electronic circuit on which the electronic components group 10 are mounted and electrically connected with each other. In this example, the substrate 20 is what is called a printed circuit board (PCB). Specifically, the substrate 20 has a circuit body formed by a wiring pattern (print pattern) made of conductive material such as copper and printed on an insulating layer made of insulating material such as epoxy resin, glass epoxy resin, paper epoxy resin, or ceramic. The electronic components group 10 are mounted on the substrate 20 by electrically connecting the terminals of the electronic components group 10 with the circuit body by soldering or the like. The circuit body of the substrate 20 electrically connects the electronic components group 10 to form a circuit system in accordance with a function requested as the DC/DC converter 1. The substrate 20 may be a multi-layer object (in other words, a multi-layer substrate) formed by stacking a plurality of insulating layers on each of which a wiring pattern is printed. In this example, the substrate 20 is formed substantially in a rectangular plate shape.

The substrate 20 according to the present embodiment includes a high-voltage region 31, a low-voltage region 32, a connection region 33, and a pair of ground regions 34.

The high-voltage region 31 is a region in which a high-voltage wiring pattern P1 (refer to FIG. 1) having a relatively high voltage is formed. The input terminal 2 is connected with the high-voltage wiring pattern P1. The low-voltage region 32 is a region in which a low-voltage wiring pattern P2 (refer to FIG. 1) having a relatively low voltage is formed. The output terminal 3 is connected with the low-voltage wiring pattern P2. The connection region 33 is a region in which a connection wiring pattern P3 (refer to FIG. 1) is formed as a wiring pattern interposed between the high-voltage wiring pattern P1 and the low-voltage wiring pattern P2. The ground regions 34 is a region in which a ground pattern P4 connected with the ground GND is formed.

The connection region 33 according to the present embodiment is positioned between the high-voltage region 31 and the low-voltage region 32 in a first direction X. The connection region 33 is positioned adjacent to the high-voltage region 31 and the low-voltage region 32 in the first direction X. In other words, the high-voltage region 31 and the low-voltage region 32 are positioned on the respective sides of the connection region 33 to sandwich them in the first direction X. The high-voltage region 31 and the low-voltage region 32 are each positioned adjacent to the connection region 33. In other words, in the substrate 20, the high-voltage region 31, the connection region 33, and the low-voltage region 32 are positioned side by side adjacent to each other in the stated order from one side to the other side in the first direction X.

The pair of ground regions 34 according to the present embodiment are positioned with the high-voltage region 31, the connection region 33, and the low-voltage region 32 interposed therebetween in a second direction Y orthogonal (intersecting) to the first direction X. The pair of ground regions 34 are positioned adjacent to the high-voltage region 31, the connection region 33, and the low-voltage region 32 in the second direction Y. In other words, the pair of ground regions 34 are positioned on the respective sides of the high-voltage region 31, the connection region 33, and the low-voltage region 32 to sandwich them in the second direction Y.

More specifically, the connection region 33 is formed as a substantially rectangular region sandwiched between the high-voltage region 31 and the low-voltage region 32. Each ground region 34 is formed as a substantially rectangular band region along the first direction X. The high-voltage region 31 and the low-voltage region 32 are formed as substantially T-shaped regions. Each ground region 34 is sandwiched between parts of the high-voltage region 31 and the low-voltage region 32 in the first direction X. In this example, an end part of each of the high-voltage region 31 and the low-voltage region 32, which is opposite to the connection region 33 side in the first direction X extends to outside edges (opposite to the connection region 33 side) of the ground regions 34 in the second direction Y. In other words, the pair of ground regions 34 sandwich parts of the high-voltage region 31 and the low-voltage region 32 in the second direction Y, and are sandwiched between other parts of the high-voltage region 31 and the low-voltage region 32 in the first direction X.

The first capacitor C1 is mounted across any one of the pair of ground regions 34 and the high-voltage region 31. The first capacitor C1 has the one terminal connected with the ground pattern P4 and the other terminal connected with the high-voltage wiring pattern P1. The high-voltage-side switching element Q1 is mounted across the high-voltage region 31 and the connection region 33. The high-voltage-side switching element Q1 has the drain terminal connected with the high-voltage wiring pattern P1 and the source terminal connected with the connection wiring pattern P3. The low-voltage-side switching element Q2 is mounted across the connection region 33 and one of the pair of ground regions 34. The low-voltage-side switching element Q2 has the drain terminal connected with the connection wiring pattern P3 and the source terminal connected with the ground pattern P4. The inductor L1 is mounted across the connection region 33 and the low-voltage region 32. The inductor L1 has the one terminal connected with the connection wiring pattern P3 and the other terminal connected with the low-voltage wiring pattern P2. The second capacitor C2 is mounted across the low-voltage region 32 and one of the pair of ground regions 34. The second capacitor C2 has the one terminal connected with the low-voltage wiring pattern P2 and the other terminal connected with the ground pattern P4.

Figure 3:
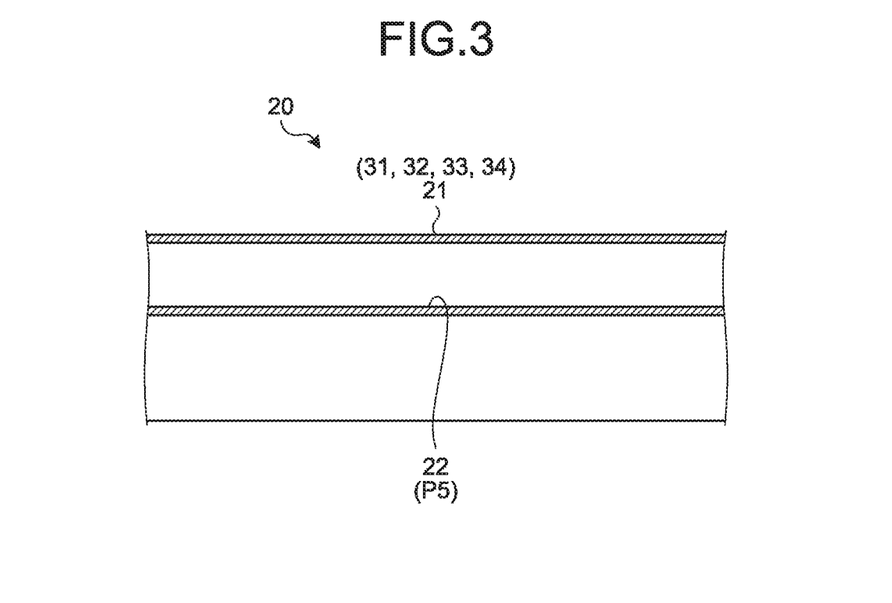
FIG. 3 is a schematic cross-sectional view for description of mounting surfaces of the substrate included in the DC/DC converter according to the embodiment.

As illustrated in FIG. 3, the substrate 20 according to the present embodiment includes a first mounting surface 21 on which the high-voltage region 31, the low-voltage region 32, the connection region 33, and the pair of ground regions 34 are formed, and a second mounting surface 22 different from the first mounting surface 21. The above-described electronic components group 10 are mounted on the first mounting surface 21. Signal transmission patterns P5 (refer to FIG. 1) configured to transmit drive signals for driving the high-voltage-side switching element Q1 and the low-voltage-side switching element Q2 is formed on the second mounting surface 22. The high-voltage-side switching element Q1 and the low-voltage-side switching element Q2 are connected with the signal transmission patterns P5 to be capable of receiving the drive signals from the controller 4 through the signal transmission patterns P5.

The first mounting surface 21 according to the present embodiment is a mounting surface positioned at the outermost surface of the substrate 20. The second mounting surface 22 according to the present embodiment is a mounting surface positioned at an inner layer of the substrate 20. The gate terminals of the high-voltage-side switching element Q1 and the low-voltage-side switching element Q2 according to the present embodiment are each connected with the signal transmission patterns P5 on the second mounting surface 22 as the inner layer of the substrate 20 through a through-hole, a via, or the like.

Since the artwork of the substrate 20 is configured as described above, the DC/DC converter 1 can have a wiring pattern disposition having high versatility in designing, and thus have improved versatility.

Figure 4:
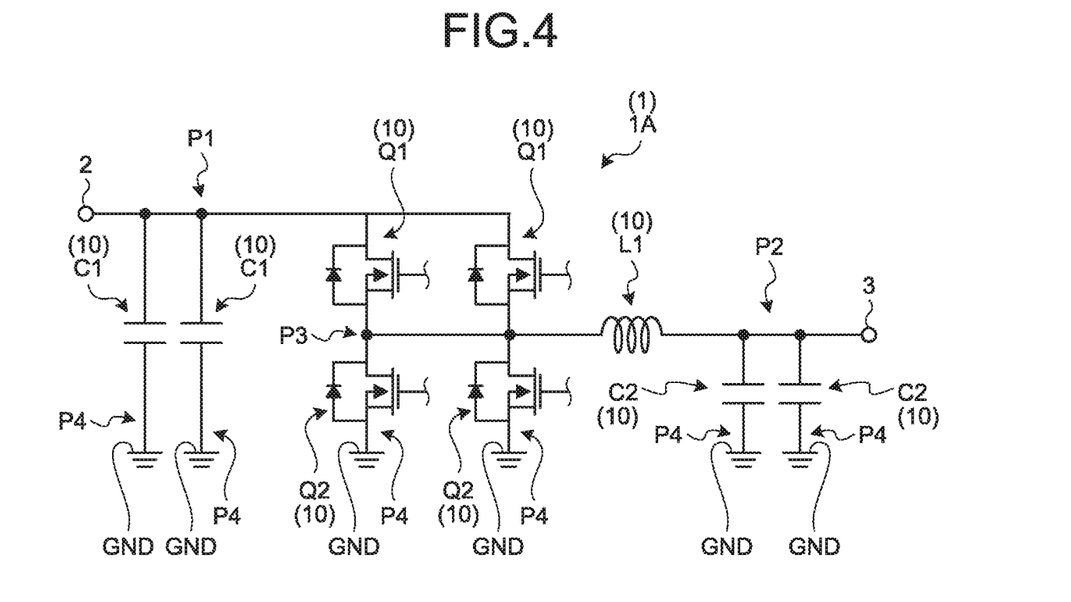
FIG. 4 is a schematic configuration diagram illustrating another configuration of the DC/DC converter according to the embodiment.
Figure 5:
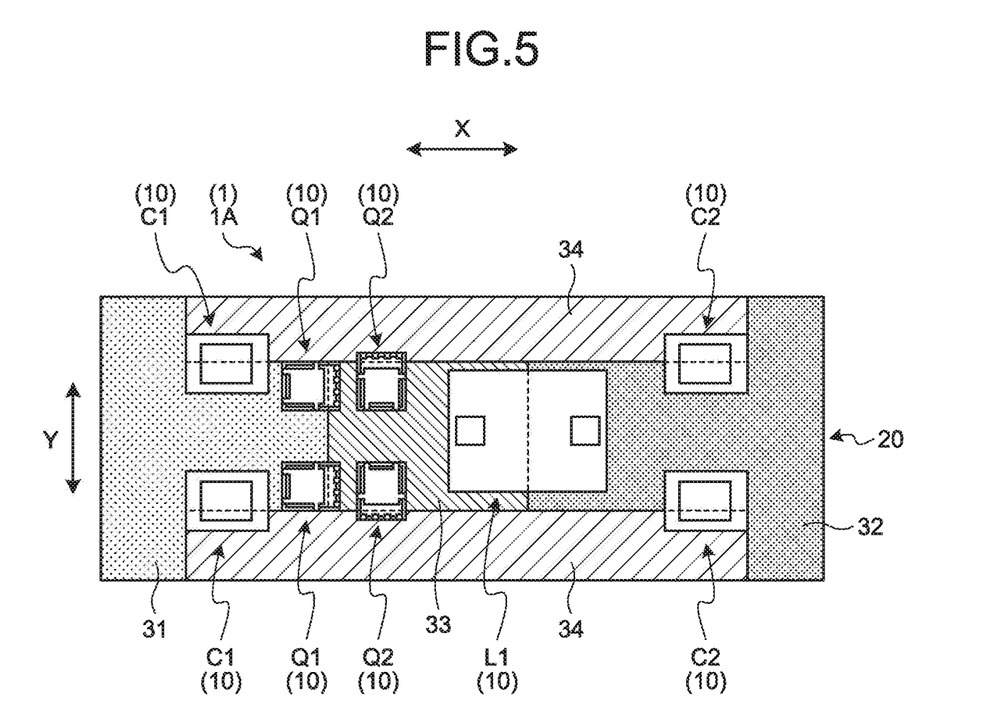
FIG. 5 is a schematic block diagram illustrating another artwork of the substrate included in the DC/DC converter according to the embodiment.

For example, a DC/DC converter 1A illustrated in FIGS. 4 and 5 is provided with a plurality of the first capacitors C1, a plurality of the high-voltage-side switching elements Q1, a plurality of the low-voltage-side switching elements Q2, and a plurality of the second capacitors C2. In this example, the DC/DC converter 1A is provided with the two first capacitors C1 in parallel, the two high-voltage-side switching elements Q1 in parallel, the two low-voltage-side switching elements Q2 in parallel, and the two second capacitors C2 in parallel. More specifically, one of the first capacitors C1 is mounted across one of the pair of ground regions 34 and the high-voltage region 31, and the other first capacitor C1 is mounted across the other of the pair of ground regions 34 and the high-voltage region 31. The high-voltage-side switching elements Q1 are both mounted across the high-voltage region 31 and the connection region 33. One of the low-voltage-side switching elements Q2 is mounted across the connection region 33 and one of the pair of ground regions 34, and the other low-voltage-side switching element Q2 is mounted across the connection region 33 and the other of the pair of ground regions 34. One of the second capacitors C2 is mounted across the low-voltage region 32 and one of the pair of ground regions 34, and the other second capacitor C2 is mounted across the low-voltage region 32 and the other of the pair of ground regions 34.

The DC/DC converter 1A configured as described above can have an artwork similar to that of the above-described DC/DC converter 1 in designing (refer to FIGS. 2 and 5).

Figure 6:
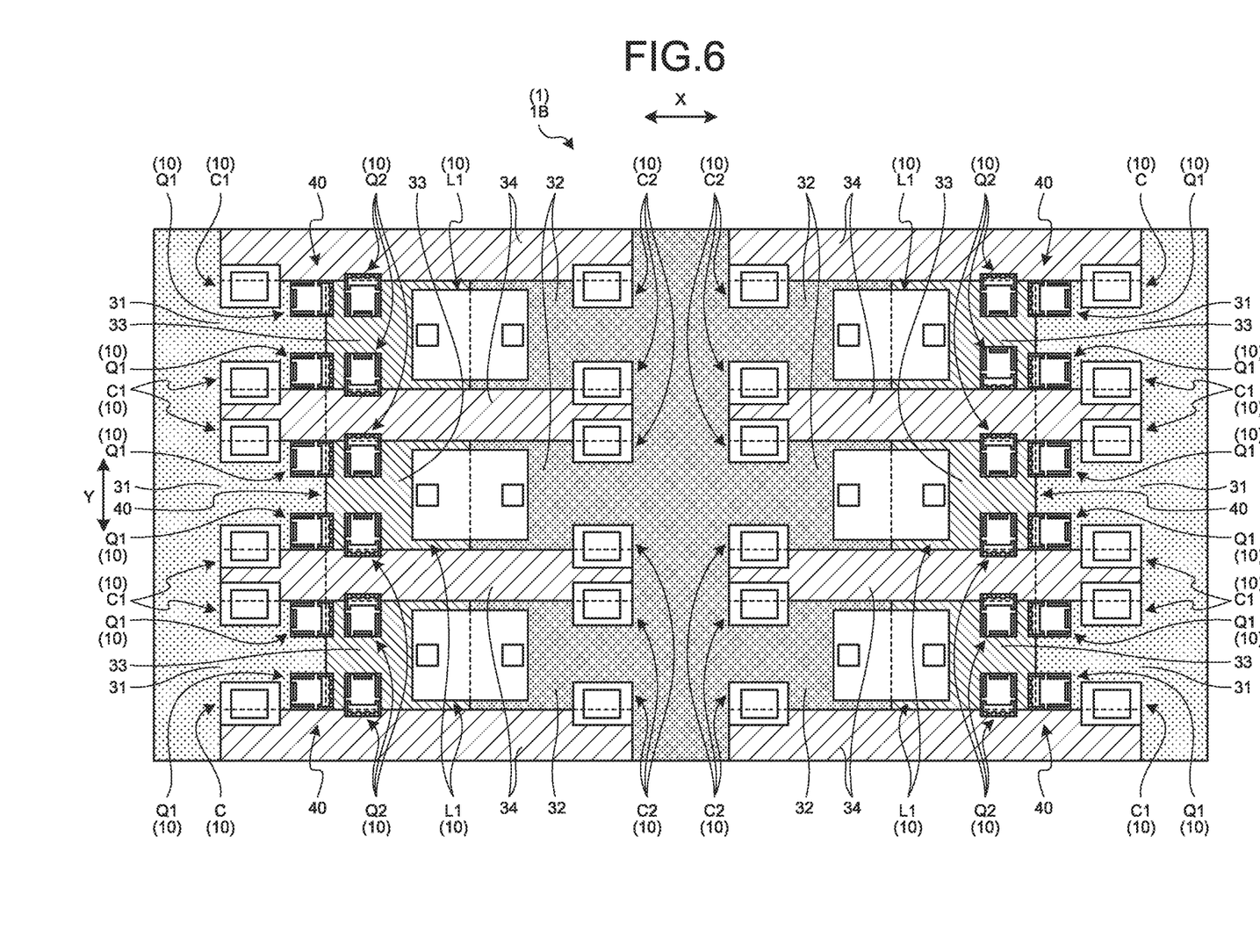
FIG. 6 is a schematic block diagram illustrating another artwork of the substrate included in the DC/DC converter according to the embodiment.

For example, a DC/DC converter 1B illustrated in FIG. 6 is a multi-phase converter in which a plurality of half-bridge circuits each forming a step-down DC/DC converter circuit are connected in parallel to achieve high power outputting. The substrate 20 included in the DC/DC converter 1B illustrated in FIG. 6 is provided with a plurality of unit pattern region groups 40 each including the single high-voltage region 31, the single low-voltage region 32, the single connection region 33, and the pair of ground regions 34. Similarly to FIGS. 4 and 5, each unit pattern region group 40 is provided with the single inductor L1, the two first capacitors C1 in parallel, the two high-voltage-side switching elements Q1 in parallel, the two low-voltage-side switching elements Q2 in parallel, and the two second capacitors C2 in parallel. In this example, the DC/DC converter 1B is a converter including a total of six unit pattern region groups 40, two arranged in the first direction X and three arranged in the second direction Y, and capable of performing six-phase operation.

In the DC/DC converter 1B, the low-voltage regions 32 of the unit pattern region groups 40 adjacent to each other in the first direction X are adjacent to and continuous with each other in the first direction X. Accordingly, in this case, in the substrate 20, the high-voltage region 31, the connection region 33, the low-voltage region 32, the connection region 33, and the high-voltage region 31 are positioned side by side adjacent to each other in the stated order from one side to the other side in the first direction X. In the DC/DC converter 1B, parts of the high-voltage and low-voltage regions 31 and 32 of the unit pattern region groups 40 adjacent to each other in the second direction Y are adjacent to and continuous with each other in the second direction Y. In the DC/DC converter 1B, one of the pair of ground regions 34 of each of the unit pattern region groups 40 adjacent to each other in the second direction Y is shared.

The DC/DC converter 1B configured as described above can have an artwork similar to that of the above-described DC/DC converter 1 in designing (refer to FIGS. 2 and 6).

In the DC/DC converters 1, 1A, and 1B described above, the electronic components group 10 including the first capacitor C1, the high-voltage-side switching element Q1, the low-voltage-side switching element Q2, the inductor L1, and the second capacitor C2 are mounted on the substrate 20 to form a half-bridge circuit. In this case, in the DC/DC converters 1, 1A, and 1B, the electronic components group 10 are connected, on the substrate 20, with the high-voltage wiring pattern P1, the low-voltage wiring pattern P2, the connection wiring pattern P3, and the ground pattern P4 in the high-voltage region 31, the low-voltage region 32, the connection region 33, and the pair of ground regions 34 disposed in a predetermined positional relation. Accordingly, the DC/DC converters 1, 1A, and 1B can each have, for example, a wiring pattern disposition having high versatility in designing, and thus have improved versatility. Thus, the configurations of the DC/DC converters 1, 1A, and 1B can be easily customizable in accordance with, for example, a customer request, a requested output, and the type of a car to which the DC/DC converter is applied, and allow desired output aspects to be easily achieved in less development man-hour.

In the DC/DC converters 1, 1A, and 1B, when the substrate 20 has an artwork as described above, the first capacitor C1, the high-voltage-side switching element Q1, and the low-voltage-side switching element Q2 can be densely disposed in a relatively small region. As a result, in the DC/DC converters 1, 1A, and 1B, the distance between each two of the first capacitor C1, the high-voltage-side switching element Q1, and the low-voltage-side switching element Q2 can be reduced to be relatively short, which can lead to reduction of noise generation.

In the DC/DC converters 1, 1A, and 1B described above, the signal transmission patterns P5 are formed on the second mounting surface 22 of the substrate 20 and connected with the gate terminals of the high-voltage-side switching element Q1 and the low-voltage-side switching element Q2. In the DC/DC converters 1, 1A, and 1B with this configuration, the high-voltage region 31, the low-voltage region 32, the connection region 33, and the pair of ground regions 34 can be provided in a positional relation as described above on the first mounting surface 21 different from the second mounting surface 22 of the substrate 20. As a result, the DC/DC converters 1, 1A, and 1B can have improved versatility as described above.

For example, in the DC/DC converter 1A described above, it is possible to appropriately use, for different components, the ground patterns P4 in the pair of ground regions 34 in the artwork of the substrate 20 as described above. Accordingly, it is possible to easily provide the DC/DC converter 1A with, for example, a plurality of first capacitors C1 in parallel, a plurality of high-voltage-side switching elements Q1 in parallel, a plurality of low-voltage-side switching elements Q2 in parallel, and a plurality of second capacitors C2 in parallel.

For example, in the DC/DC converter 1B described above, the single high-voltage region 31, the single low-voltage region 32, the single connection region 33, and the pair of ground regions 34 form the single unit pattern region group 40 in the artwork of the substrate 20 as described above. When a plurality of such unit pattern region groups 40 are provided on the substrate 20, the DC/DC converter 1B can function as a multi-phase converter. In this case, for example, the number of phases of the DC/DC converter 1B can be easily adjusted as appropriate in accordance with the number of unit pattern region groups 40.

In the DC/DC converter 1B described above, the low-voltage regions 32 of a plurality of unit pattern region groups 40 adjacent to each other in the first direction X are positioned adjacent to each other in the first direction X. In the DC/DC converter 1B with this configuration, the low-voltage regions 32 of the unit pattern region groups 40 can be connected with each other in an appropriate positional relation.

In the DC/DC converter 1B described above, one of the pair of ground regions 34 of each of a plurality of unit pattern region groups 40 adjacent to each other in the second direction Y is shared. In the DC/DC converter 1B with this configuration, increase in the size of the substrate 20 can be reduced, which also can lead to improved versatility.

The DC/DC converters according to the embodiment of the present invention described above is not limited to the embodiment but can be changed in various kinds of manners within the scope of the claims.

In the above description, the substrate 20 has the configuration in which the first mounting surface 21 is positioned at the outermost surface of the substrate 20, and the second mounting surface 22 is positioned at an inner layer of the substrate 20, but is not limited thereto. In the substrate 20, the first mounting surface 21 may be positioned at an inner layer of the substrate 20, and the second mounting surface 22 may be positioned at the outermost surface of the substrate 20, or both may be positioned at the outermost surface.

In a DC/DC converter according to the present embodiments, electronic components group including a first capacitor, a high-voltage-side switching element, a low-voltage-side switching element, an inductor, and a second capacitor are mounted on a substrate and form a half-bridge circuit. In this configuration, the above-described electronic components group are connected, on the substrate of the DC/DC converter, with a high-voltage wiring pattern including a high-voltage region, a low-voltage region, a connection region, and a pair of ground regions disposed in a predetermined positional relation, a low-voltage wiring pattern, a connection wiring pattern, and a ground pattern. Accordingly, the DC/DC converter can have, for example, a wiring pattern disposition having high versatility in designing, and thus have improved versatility.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A DC/DC converter comprising:
electronic components group including a first capacitor, a high-voltage-side switching element, a low-voltage-side switching element, an inductor, and a second capacitor and forming a half-bridge circuit; and
a substrate including a high-voltage region in which a high-voltage wiring pattern having a relatively high voltage is formed, a low-voltage region in which a low-voltage wiring pattern having a relatively low voltage is formed, a connection region in which a connection wiring pattern is formed, and a pair of ground regions in each of which a ground pattern is formed, wherein
the connection region is positioned between the high-voltage region and the low-voltage region in a first direction and adjacent to the high-voltage region and the low-voltage region,
the pair of ground regions are positioned adjacent to the high-voltage region, the connection region, and the low-voltage region with the high-voltage region, the connection region, and the low-voltage region interposed between the ground regions in a second direction intersecting the first direction,
the first capacitor is mounted across any one of the pair of ground regions and the high-voltage region and has one terminal connected with the ground pattern and the other terminal connected with the high-voltage wiring pattern,
the high-voltage-side switching element is mounted across the high-voltage region and the connection region and has a drain terminal connected with the high-voltage wiring pattern and a source terminal connected with the connection wiring pattern,
the low-voltage-side switching element is mounted across the connection region and the one of the pair of ground regions and has a drain terminal connected with the connection wiring pattern and a source terminal connected with the ground pattern,
the inductor is mounted across the connection region and the low-voltage region and has one terminal connected with the connection wiring pattern and the other terminal connected with the low-voltage wiring pattern,
the second capacitor is mounted across the low-voltage region and the one of the pair of ground regions and has one terminal connected with the low-voltage wiring pattern and the other terminal connected with the ground pattern,
a plurality of the first capacitors are provided, one of the first capacitors is mounted across one of the pair of ground regions and the high-voltage region, and another one of the first capacitors is mounted across the other of the pair of ground regions and the high-voltage region,
a plurality of the high-voltage-side switching elements are provided and all of the high-voltage-side switching elements mounted across the high-voltage region and the connection region,
a plurality of the low-voltage-side switching elements are provided, one of the low-voltage-side switching elements is mounted across the connection region and the one of the pair of ground regions, and another one of the low-voltage-side switching elements is mounted across the connection region and the other of the pair of ground regions, and
a plurality of the second capacitors are provided, one of the second capacitors is mounted across the low-voltage region and the one of the pair of ground regions, and another one of the second capacitors is mounted across the low-voltage region and the other of the pair of ground regions.

2. The DC/DC converter according to claim 1, wherein
the substrate includes a first mounting surface and a second mounting surface different from the first mounting surface, the high-voltage region, the low-voltage region, the connection region, and the pair of ground regions being formed on the first mounting surface, signal transmission patterns configured to transmit drive signals for driving the high-voltage-side switching element and the low-voltage-side switching element being formed on the second mounting surface, and
the high-voltage-side switching element and the low-voltage-side switching element have gate terminals connected with the signal transmission patterns.

3. The DC/DC converter according to claim 1, wherein
the substrate is provided with a plurality of unit pattern region groups each including the single high-voltage region, the single low-voltage region, the single connection region, and the pair of ground regions.

4. The DC/DC converter according to claim 2, wherein
the substrate is provided with a plurality of unit pattern region groups each including the single high-voltage region, the single low-voltage region, the single connection region, and the pair of ground regions.

5. The DC/DC converter according to claim 3, wherein
the low-voltage regions of the plurality of unit pattern region groups adjacent to each other in the first direction are positioned adjacent to each other in the first direction.

6. The DC/DC converter according to claim 3, wherein
one of the pair of ground regions of each of a plurality of the unit pattern region groups adjacent to each other in the second direction is shared.

7. The DC/DC converter according to claim 4, wherein
the low-voltage regions of the plurality of unit pattern region groups adjacent to each other in the first direction are positioned adjacent to each other in the first direction.

8. The DC/DC converter according to claim 4, wherein
one of the pair of ground regions of each of a plurality of
   the unit pattern region groups adjacent to each other in
   the second direction is shared.

9. The DC/DC converter according to claim 5, wherein
one of the pair of ground regions of each of a plurality of
   the unit pattern region groups adjacent to each other in
   the second direction is shared.

10. The DC/DC converter according to claim 7, wherein
one of the pair of ground regions of each of a plurality of
   the unit pattern region groups adjacent to each other in
   the second direction is shared.

\* \* \* \* \*